(12) United States Patent
Haenichen et al.

(10) Patent No.: US 10,180,473 B2
(45) Date of Patent: Jan. 15, 2019

(54) LOW-STRAY-FIELD PERMANENT MAGNET ARRANGEMENT FOR MR APPARATUSES

(71) Applicant: Bruker BioSpin GmbH, Rheinstetten (DE)

(72) Inventors: Lukas Haenichen, Karlsruhe (DE); Rainer Pietig, Malsch (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 189 days.

(21) Appl. No.: 15/449,332

(22) Filed: Mar. 3, 2017

(65) Prior Publication Data

US 2017/0254866 A1    Sep. 7, 2017

(30) Foreign Application Priority Data

Mar. 4, 2016  (DE) ........................ 10 2016 203 588

(51) Int. Cl.
  *G01R 33/383*  (2006.01)
  *G01R 33/389*  (2006.01)
(52) U.S. Cl.
  CPC ......... *G01R 33/383* (2013.01); *G01R 33/389* (2013.01)
(58) Field of Classification Search
  CPC ............................ G01R 33/383; G01R 33/389
  See application file for complete search history.

(56) References Cited

U.S. PATENT DOCUMENTS

| 4,644,313 A | * | 2/1987 | Miyajima | ............ G01R 33/381 |
| | | | | 324/318 |
| 4,672,346 A | * | 6/1987 | Miyamoto | .............. B29C 67/20 |
| | | | | 335/296 |

(Continued)

FOREIGN PATENT DOCUMENTS

| DE | 102009047672 A1 | 6/2011 |
| DE | 11 2012 003 269 T2 | 6/2014 |

(Continued)

OTHER PUBLICATIONS

Office Action in corresponding Japanese Application 2017039989 dated Mar. 30, 2018, along with English Translation, 6 pages.

(Continued)

*Primary Examiner* — G. M. A. Hyder
(74) *Attorney, Agent, or Firm* — Edell, Shapiro & Finnan, LLC

(57) ABSTRACT

A magnetic resonance arrangement with a permanent magnet system and having magnet elements, pole piece elements and yoke elements of magnetic material arranged cylinder-symmetrically with respect to the z axis. The yoke elements have a first lid (11') and a second lid (11") and also a hollow cylindrical drum (12) arranged axially between the lids. The yoke elements enclose the measuring volume in the axial and radial direction. The magnet elements each include a pair of cylinder-symmetrical axial magnets (13', 13") and also radial magnet rings (14', 14"). The axial magnets are each arranged axially adjoining the lids and are arranged radially within the radial magnet rings and respectively axially further away from the measuring volume than the radial magnet rings. The outer diameter of the axial magnets is less than or equal to the inner diameter of the radial magnet rings.

18 Claims, 14 Drawing Sheets

(56) References Cited

U.S. PATENT DOCUMENTS

| | | | | |
|---|---|---|---|---|
| 4,994,778 | A * | 2/1991 | Leupold | H05H 7/04 315/5.28 |
| 5,014,032 | A * | 5/1991 | Aubert | G01R 33/383 324/318 |
| 5,332,971 | A * | 7/1994 | Aubert | G01R 33/383 324/302 |
| 6,275,039 | B1 * | 8/2001 | Young | G01R 33/3808 324/300 |
| 7,084,633 | B2 | 8/2006 | Aoki et al. | |
| 7,148,777 | B2 | 12/2006 | Chell et al. | |
| 8,077,002 | B2 | 12/2011 | Lian et al. | |
| 9,159,479 | B2 | 10/2015 | Rotem | |
| 2003/0123610 | A1 | 7/2003 | Okanda et al. | |
| 2008/0084967 | A1 | 4/2008 | Matsuo et al. | |
| 2008/0157620 | A1 * | 7/2008 | Longo | H02K 1/223 310/156.78 |
| 2010/0231219 | A1 * | 9/2010 | Manz | G01R 33/383 324/319 |
| 2011/0135059 | A1 | 6/2011 | Ollinger | |

FOREIGN PATENT DOCUMENTS

| | | |
|---|---|---|
| EP | 1324023 A2 | 7/2003 |
| EP | 1912061 A1 | 4/2008 |
| JP | H0429305 A | 1/1992 |
| JP | H0442509 A | 2/1992 |
| JP | H06505124 A | 6/1994 |
| JP | H0949811 A | 2/1997 |
| JP | 2001070280 A | 3/2001 |
| JP | 2004041715 A | 2/2004 |

OTHER PUBLICATIONS

Communication under Rule 71(3) EPC dated Mar. 14, 2018, 29 pages.

* cited by examiner

LOW-STRAY-FIELD PERMANENT MAGNET ARRANGEMENT FOR MR APPARATUSES

CROSS REFERENCE TO RELATED APPLICATIONS

This application claims foreign priority under 35 U.S.C. § 119(a)-(d) to German Application No. 10 2016 203 588 filed on Mar. 4, 2016, the entire contents of which are hereby incorporated by reference.

FIELD OF INVENTION

The present invention relates generally to the area of magnetic resonance, in particular the provision of permanent magnet systems which are suitable for this purpose and which are intended to generate homogeneous magnetic fields for NMR measurements. However, the use of the invention is not limited to this area.

BACKGROUND

More specifically, the invention relates to a magnet arrangement in a magnetic resonance apparatus with a permanent magnet system for generating a homogeneous magnetic field in the direction of a z axis in a measuring volume, the permanent magnet system having magnet elements, pole piece elements and yoke elements of magnetic material arranged cylinder-symmetrically with respect to the z axis.

A magnet arrangement of this kind is known from U.S. Pat. No. 7,084,633 B2.

Magnetic resonance (including nuclear magnetic resonance (NMR) and including electron spin resonance (ESR)) is a widely used measuring method with which chemical compounds can be analysed. In the area of NMR spectroscopy and in MR imaging, a very homogeneous and temporally constant magnetic field is required in a sample volume to be defined, said magnetic field being able to be generated with resistive or supraconductive coils or with a suitable permanent magnet arrangement. The use of permanent magnets is preferred if flux densities of well below 2T are sufficient and if a relatively compact structure is desired.

To maximize the magnetic flux in the sample volume and thus at the same time to minimize the stray flux, the magnetic flux has to be focussed. In this context, a distinction is made between magnetic circuits in which the magnetic return path is through a yoke made of a soft-magnetic material, or those magnetic circuits that do not need a yoke. The latter are in most cases modifications of so-called Halbach magnets, where the return is simplified by a gradual change of the direction of magnetization. In practice, a Halbach array is typically obtained through a stepwise change of the direction of magnetization. This departure from the ideal Halbach magnetization contributes to increasing the stray field outside the actual magnet arrangement and makes additional shielding necessary for applications that are free of stray field. In yoke-based magnets, sufficient shielding of the stray field can be achieved well below the saturation flux density through skilful design of the yoke and use of the yoke material.

The permanent magnets are typically held by a support structure, which can additionally perform the function of the magnetic return path. Traditional designs have a yoke in the form of a rectangular frame (window frame, H-yoke, C-yoke), with two central magnet assemblies arranged opposite each other, between which the sample volume is located. On account of their open structure, these yoke designs are also often affected by stray fields that extend far beyond the outer contours of the magnet arrangement.

To achieve the field homogeneity that is required in the sample volume for NMR measurements, the yoke-free Halbach magnets have to be provided with correction mechanisms in order to be able to compensate for tolerances of the magnetic material or the position of the individual magnet blocks, and this complicates the mechanical construction. Yoke-based magnets generally have a parallel pair of pole pieces made of a soft-magnetic material with suitably high saturation flux density. By suitable selection of the geometry of the pole pieces and special treatment of the surfaces, the field profile can be optimized in a comparatively simple and efficient way.

U.S. Pat. No. 8,077,002 B2 discloses a permanent magnet device for MRI applications. It involves a pair of solid disc-shaped magnets which in parallel delimit the air gap as plane of symmetry and each comprise an offset (protruding) ring magnet, such that an L-shaped magnet is obtained. Pole pieces are arranged on both sides of the air gap for the parallel orientation of the magnetic field in the air gap. The so-called L-magnet arrangement is held by a T-yoke consisting of the components $114a,b$ and $110a,b$. Since the magnet arrangement in question is an open structure, this T-yoke is necessary for structural reasons. The described T-yoke lines are connected by an additional web as magnetic return path.

U.S. Pat. No. 7,084,633 B2, cited in the introduction, discloses a magnet arrangement for MRT appliances using permanent magnets. The permanent magnets are arranged in such a way that a pair of central permanent magnets are connected to respective pole pieces, the measuring volume being located in the space between them. The magnetization of the two magnets is oriented in the same direction, such that the magnetic flux flows through the measuring volume in a defined direction. Further segments of permanent magnets are arranged in a circular shape around said magnets, wherein the direction of magnetization of the magnets is oriented radially outwards and radially inwards, such that the magnetic field is strengthened within the measuring volume. To return the magnetic field, plates made of ferromagnetic material are arranged to form a yoke. For structural reasons, and in order to guide the magnetic flux of the corner segments, supporting yokes are required at the respective corners.

However, all of the known permanent magnet systems for magnetic resonance have the following disadvantages, some of them serious:

- Generation of a considerable magnetic stray field in the external environment of the MR apparatus
- System-related large volume of the known permanent magnet systems and, therefore, large amount of space needed and high expenditure in terms of material
- Easy displaceability of the system components relative to each other on account of the high magnetic forces that occur, and resulting problems as regards long-term operation, and expensive design measures for safely preventing displacement.

As regards the last-mentioned point, it should be noted that the manufacturers of the known designs in some cases (have to) take considerable extra effort to reliably ensure that nothing is displaced. This requires design measures, for example reinforcements, supports, etc., which generally make the structure considerably heavier and larger. Displacement of individual assemblies may adversely affect the homogeneity of the magnet or, in the worst case scenario, damage objects within the sample volume (risk of crushing). Not least, movable assemblies may also cause a problem during fitting, e.g. because housing elements are then still incomplete.

SUMMARY

Accordingly, one object of the present invention is to substantially reduce the magnetic stray field in the external environment of a permanent magnet arrangement of the type defined in the introduction. Further objects are to do so by simple technical measures and without increasing the volume of the magnet arrangement. By achieving these objects, it is possible to enhance the long-term reliability of the system vis-à-vis systems that utilize mechanical displacement of components during operation. Also, the system as a whole can be configured considerably more compact.

These objects are achieved by the present invention, in a surprisingly simple and effective way, in that the yoke elements comprise a first lid and a second lid and also at least one hollow cylindrical drum arranged axially between the lids with respect to the z axis. The yoke elements enclose the measuring volume both in the axial direction and in the radial direction, and the magnet elements comprise at least one pair of cylinder-symmetrical axial magnets and one pair of cylinder-symmetrical radial magnet rings. The axial magnets are each arranged axially adjoining the side of the first lid and the side of the second lid facing towards the measuring volume, while the radial magnet rings are each arranged axially adjoining the side of the first axial magnet or the side of the second axial magnet facing towards the measuring volume, and wherein: the outer diameter of the axial magnets is less than or equal to the inner diameter of the radial magnet rings.

Such a yoke enclosing the measuring volume reduces the stray field to a considerable extent. On account of the closed yoke design composed of jacket and lid (except for the lateral access openings described below), the stray field in the external environment is practically negligible.

By virtue of the design according to the invention, the magnetic components are secured against undesired movements. On account of the novel geometric shape of the components and also of the yoke, adjoining components are prevented from unwanted movement in the fitted state. The form-fit arrangement of the magnet assemblies and yoke parts results in the intrinsic safety of the system:
In the assembled state, all of the magnets are secured against movement in the direction of the forces that occur. The special yoke geometry, in conjunction with the geometry of the magnets, has the effect that all of the components are fixed in their end positions, in a manner comparable, for example, to the stone wedges in an archway.

The drum shape according to the invention leads in principle, and even by necessity, to a more compact structure. Moreover, this arrangement is also more efficient, in terms of the material used, than other magnet arrangements known from the prior art and exhibiting comparable technical key data (air gap, diameter of the spherical homogeneity area, nominal flux density).

The division according to the invention into lid assembly and drum assembly permits a separate construction of the individual assemblies, wherein the individual magnets can be fitted in place transverse to the magnetic force and therefore in a way that saves force. The radial magnet segments are fitted in place so as to slide on the inner face of the yoke, i.e. slide in the z direction, while the axial magnets are mounted in place sliding on the rear face of the pole piece radially with respect to the center of the pole piece.

By virtue of the drum shape according to the invention, the segments of the ring magnet can be more easily fitted, in particular without additional supporting yokes. By contrast, in magnet arrangements according to the prior art, the secondary magnets contact the actual pole piece, i.e. the ferromagnetic material. This is not the case in the invention. Here, for design reasons, there is always a small air gap between them, because primary and secondary magnets are fastened on different assemblies and are movable relative to each other (lid adjustment). The resulting mobility of the lid assemblies relative to the drum assembly can be used for an adjustment mechanism for adjusting the field homogeneity.

The rotationally symmetrical structure resulting from the cylindrical geometry adapts optimally to the shape of the measuring volume, such that the use of material is made considerably more efficient by the shorter average iron path length compared to rectangular arrangements.

Moreover, the rotational symmetry according to the invention means that the yoke components can be produced extremely cost-effectively on a lathe. Finally, simple sequential fitting on a rotary platform is also possible.

An embodiment of the magnet arrangement according to the invention is particularly preferred in which the yoke elements, the magnet elements and the pole piece elements each have circular cylinder symmetry or cylinder symmetry with polygonal cross-sectional surfaces perpendicular to the z axis. This type of symmetry permits cyclical assembling, i.e. a stationary "fitting-out device" and a "revolver", which positions the cylinder sector to be fitted out in front of the fitting-out device and, after partial fitting, pivots it further by rotation to the next cylinder sector. This can be achieved particularly easily with the circular cylinder, since the drum can then be mounted on rollers and actually brought to position by rotation as in a drum revolver.

In a further embodiment, provision is made that the yoke elements comprise a plurality of hollow cylindrical drums arranged one after another in the axial direction. Such an embodiment allows more magnetic material to be installed along the circumference while the pole diameter remains the same. This may also lead to a modular concept for producing different field strengths using identical subassemblies.

An embodiment is particularly preferred in which the radial magnet rings and/or the axial magnets are divided segment-like or wedge-like in the radial direction and/or parallel to the drum circumference in the azimuthal direction. The advantages of this variant lie in the ready availability of the raw magnets used. With corresponding availability of sintered components, this segmentation may also be dispensed with in other embodiments of the invention.

An embodiment is also advantageous in which the hollow cylindrical drum(s) of the yoke elements has (have), on its (their) outer jacket surface(s), at least one circumferential groove and/or at least one circumferential step and/or, on its (their) inner surface, a stepped profile. Embossed features of this kind can serve as guide elements during assembly or as rails for displaceable add-on parts.

A preferred embodiment is characterized in that the hollow cylindrical drum(s) of the yoke elements has (have) at least one aperture or preferably several apertures or access openings arranged radially opposite one another in pairs with respect to the z axis. These openings provide access to the sample space between the poles, and they at the same time serve as maintenance openings for assemblies such as gradient coils, shim systems, etc.

In another advantageous embodiment, provision is made that the first lid and/or the second lid of the yoke elements is discus-shaped or tapers conically in the axial direction away from the measuring volume. Conically tapering end assemblies serve to shorten the average iron path for the magnetic flux in the yoke and permit material savings and therefore also a reduction in weight.

An embodiment is also preferred in which the first lid and/or the second lid of the yoke elements has a centring portion, along the z axis, protruding in the axial direction towards the measuring volume. This portion can be designed as a depression or elevation and helps in the concentric orientation of lid and magnet ring.

In another preferred embodiment, the first lid and/or second lid of the yoke elements has, on its side protruding towards the measuring volume, an annular groove, a step or a shoulder as a limit stop or for holding the axial magnets. Since the magnets, when they are being fitted, are brought to their respective position under considerable force, the limit stop position has to ensure a uniform end position or has to prevent displacement beyond the intended position.

An embodiment is particularly preferred in which the pole piece elements are configured in the axial direction in multiple parts, in particular in two parts with a pole plate and a pole cap, or in three parts with an additional pole ring. Diverse pole piece configurations in order to achieve a good basic homogeneity. In magnet systems where pulsed gradients are used, the material (pole cap) facing towards the sample space must be electrically non-conductive. Such materials have reduced mechanical load-bearing capacity, and therefore, for example, the base plate facing towards the magnets may be produced from iron or another load-bearing ferromagnetic material.

An embodiment is also advantageous in which the pole piece elements are fixed on the respectively adjacent first lid or second lid of the yoke elements with at least one fastening element of non-magnetic material, in particular with of a pin, a bolt or a screw. The bracing of the lid with the rear pole piece element is a central aspect of the safety concept according to the invention. The pole surfaces are attracted magnetically; the connection to the lid prevents parts of the central assembly from moving in the direction of the sample volume if adhesive bonds fail.

Further preferred embodiments of the magnet arrangement according to the invention are characterized in that, on the abutment faces between the lids and the drum, one or more adjusting elements are arranged, for example in the form of adjusting screws, with which the abutment angle and/or the distance between the lids and the drum, preferably in the range≤1 mm, is adjustable and the magnetic field can thereby be homogenized. The lids can thus be pressed on parallel at a distance to the drum or with minimal tilting. Undesired linear gradients can thus be compensated to a certain extent.

The present invention also covers a method for producing a magnet arrangement, comprising:

making available the lids and hollow cylindrical drum(s) of the yoke elements arranging the radial magnet rings on the inner surface of the drum(s)

fixing the axial magnets and the pole pieces on the first lid and on the second lid of the yoke elements moving the axial magnets, fixed on the lids, together with the pole pieces into the respective radial magnet rings, which are located radially within the drum(s), such that the lids bear on the hollow cylindrical drum(s) of the yoke elements, and the axial magnets are arranged at a defined position at least partially radially within the radial magnet rings.

When fitting already magnetized permanent magnets, attractive and repulsive forces of the order of several tons occur. These forces have to be withstood or taken up during fitting in order to bring the magnet elements safely to the intended positions. This can be done particularly effectively using the assembly method described here.

An advantageous variant of this method is characterized in that, in order to homogenize the magnetic field, the first lid and/or the second lid is tilted relative to the z axis and/or rotated in the radial direction.

The lids can thus be pressed on parallel at a distance to the drum or with minimal tilting. Undesired linear gradients can thus be compensated to a certain extent.

A further method variant is also preferred in which the radial magnet rings are mounted on the inner face of the hollow cylindrical drum(s) at positions predefined by projections, steps or grooves. Since the magnets, when they are being fitted, are brought to their respective position under considerable force, the limit stop position has to ensure a uniform end position or has to prevent displacement beyond the setpoint position.

Further advantages of the invention will become clear from the description and from the drawing. Similarly, according to the invention, the features mentioned above and the features that are set out further below can be used singly or in any desired combinations. The embodiments that are shown and described should not be understood in an exhaustive sense, but rather as examples used to explain various aspects of the invention.

BRIEF DESCRIPTION OF THE DRAWINGS

The invention is shown in the drawing and is explained in more detail on the basis of illustrative embodiments. In the drawing.

DETAILED DESCRIPTION

Figure 1A:
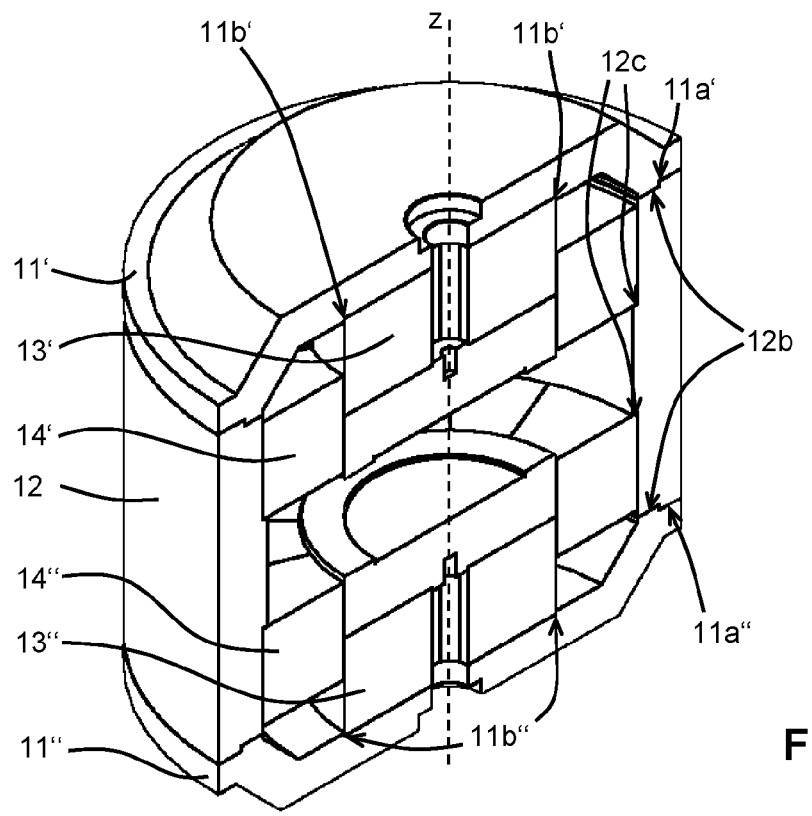
FIG. 1A shows a schematic perspective half-section view of a magnet arrangement according to the invention.
Figure 1B:
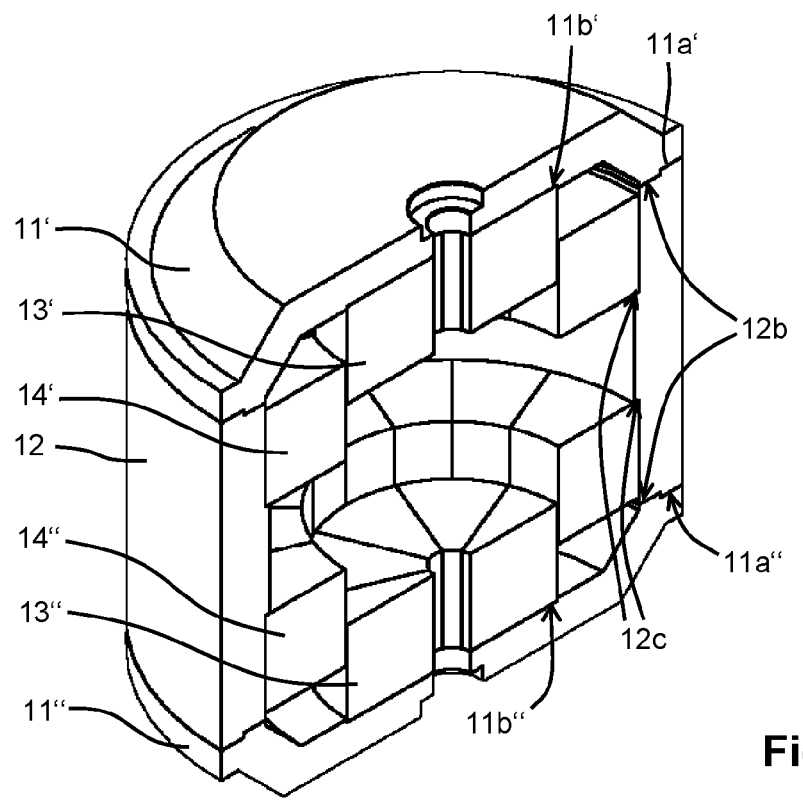
FIG. 1B shows the same as FIG. 1A, but without pole pieces.
Figure 1C:
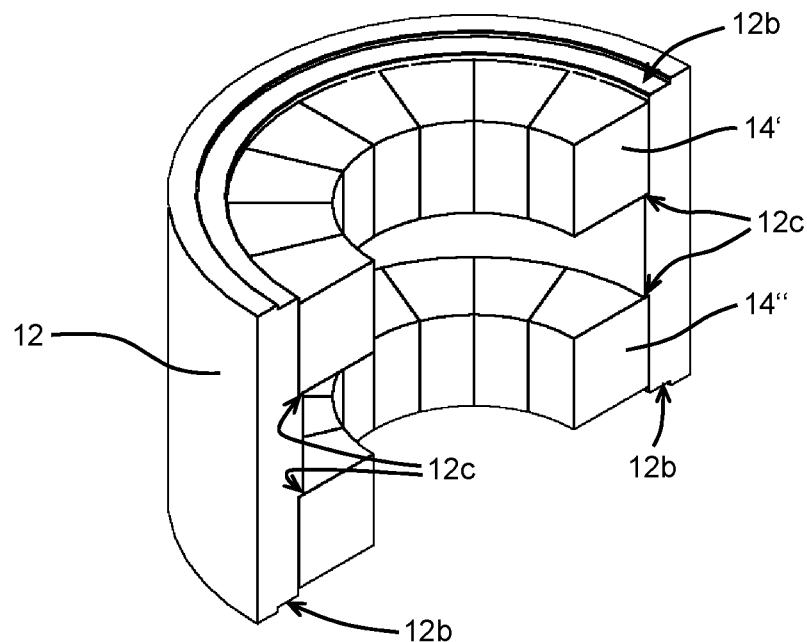
FIG. 1C shows the same as FIG. 1B, but without lid assemblies.
Figure 11:
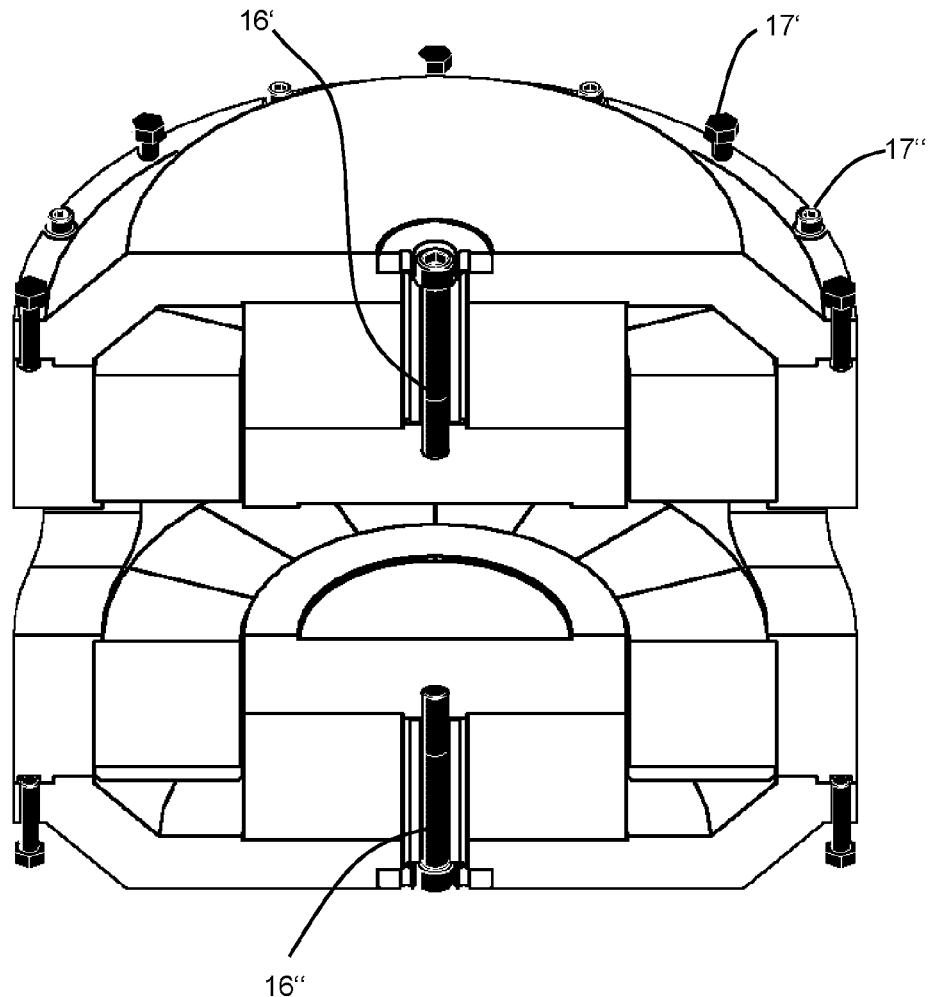
FIG. 11 shows the same as FIGS. 1A-1C, but with fastening elements and adjusting elements for adjusting the lid elements.

The magnet arrangement according to the invention, as shown schematically in a perspective half section in FIGS. 1A and 11, has its main use as a constituent part of a magnetic resonance apparatus with a permanent magnet system for generating a homogeneous magnetic field in the direction of a z axis in a (shown explicitly in FIG. 9) measuring volume MV. The permanent magnet system has magnet elements, pole piece elements and yoke elements of magnetic material that are arranged with cylinder symmetry with respect to the z axis. According to the invention, the magnet arrangement is characterized in that the yoke elements comprise a first lid 11' and a second lid 11" and also at least one hollow cylindrical drum 12; 12',12",12'"; 22a; 22b; 22c; 22d arranged axially between the lids 11', 11" with respect to the z axis, for which different advantageous embodiments are also shown in FIGS. 3A, 3B, 4A-4D, 5A, and 5D.

The yoke elements enclose the measuring volume MV both in the axial direction and in the radial direction. The magnet elements comprise at least one pair of cylinder-symmetrical axial magnets 13', 13" and a pair of cylinder-symmetrical radial magnet rings 14', 14", wherein the axial magnets 13', 13" are arranged axially adjoining the side of the first lid 11' and adjoining the side of the second lid 11" facing towards the measuring volume MV. The axial magnets 13', 13" are arranged radially within the radial magnet rings 14', 14" and are each axially further away from the measuring volume MV than are the radial magnet rings 14', 14". The external diameter of the axial magnets 13', 13" is smaller than or equal to the internal diameter of the radial magnet rings 14', 14".

The yoke elements, the magnet elements and the pole piece elements can each have circular cylinder symmetry or cylinder symmetry with polygonal cross-sectional surfaces perpendicular to the z axis.

The radial magnet rings 14', 14" and/or the axial magnets 13', 13" can be divided segment-like or wedge-like in the radial direction and/or parallel to the drum circumference in the azimuthal direction, as can be seen clearly in FIGS. 1A to 1C, 6A to 8B and 11.

It will also be seen from FIGS. 1A to 1C, 3A, 3B, 4C and 4D that the hollow cylindrical drums 12; 12',12",12'"; 22c; 22d of the yoke elements can have, on their outer jacket surfaces, at least one circumferential groove 12a and/or at least one circumferential step 12b and/or can have a step profile 12c on their inner surfaces.

It will likewise be clearly seen from FIGS. 1A to 2, 4C and 4D that the first lid 11' and/or the second lid 11" of the yoke elements can have, on its side protruding towards the measuring volume MV, an annular groove, a step 11a'; 11a" or a shoulder 11b'; 11b" as a limit stop or for holding the axial segments 13', 13".

Figure 2:
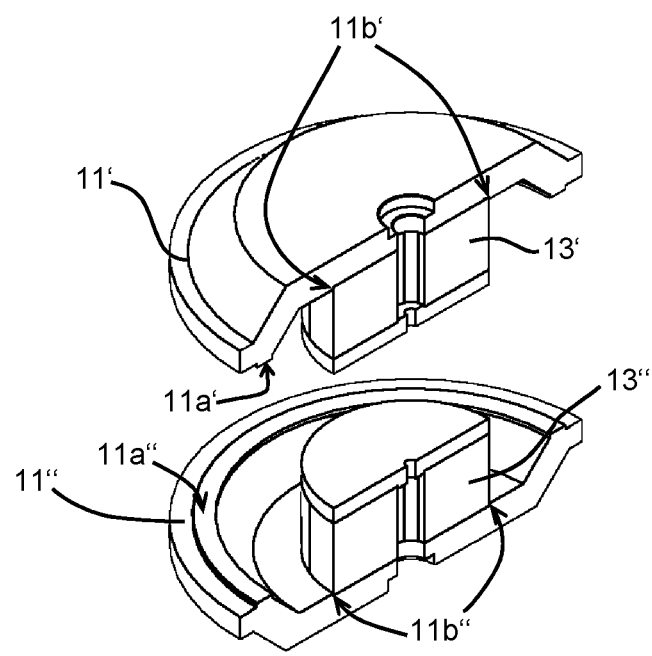
FIG. 2 shows lid assembles as in FIG. 1A.

As is shown in FIG. 2 for example, the first lid 11' and/or the second lid 11" of the yoke elements can be discus-shaped or can taper conically in the axial direction away from the measuring volume MV.

In embodiments of the invention that are not specially depicted in the drawing, the first lid 11' and/or the second lid 11" of the yoke elements can have, along the z axis, a centring portion that protrudes in the axial direction towards the measuring volume MV.

Figure 3A:
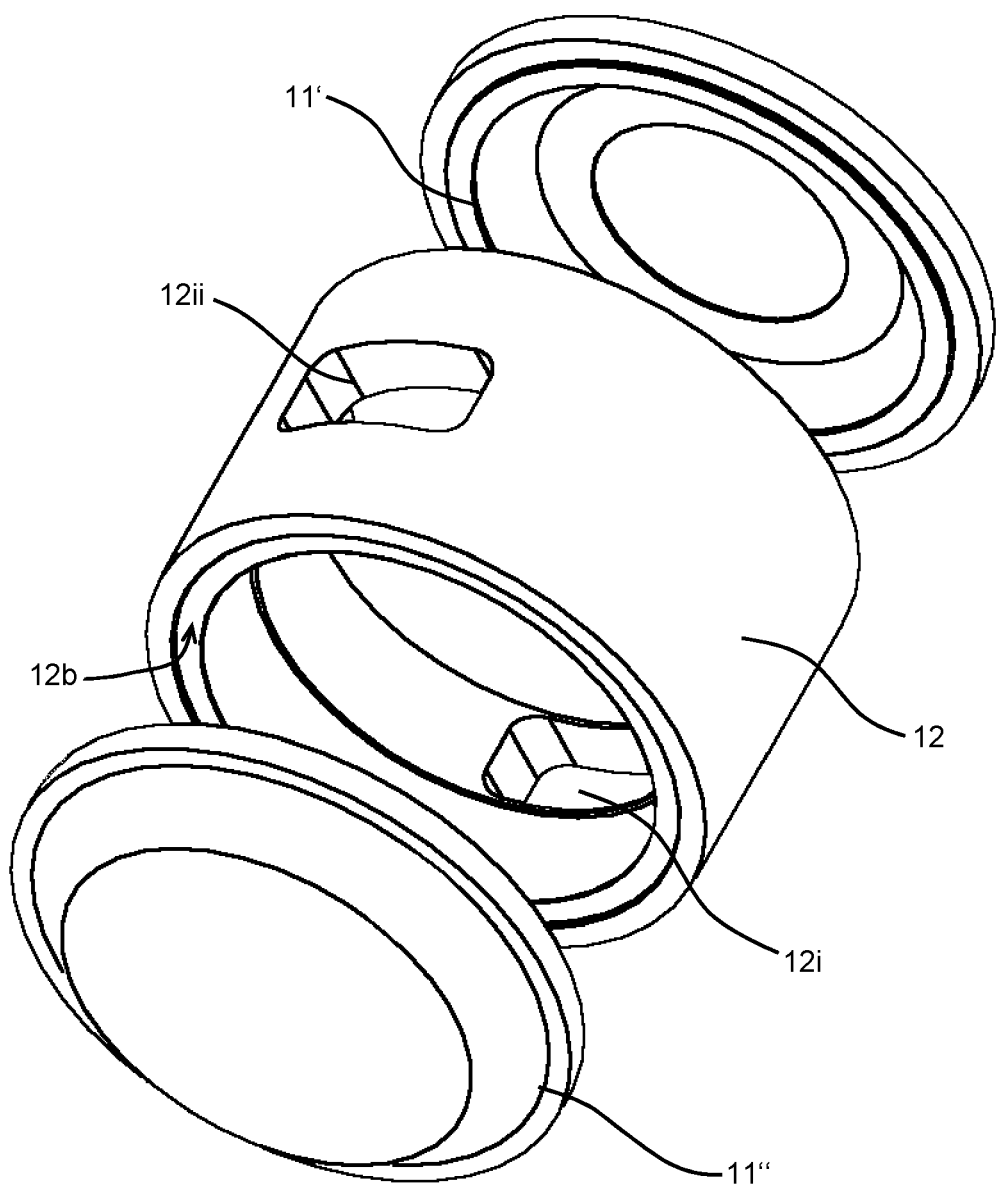
FIG. 3A shows yoke assemblies with drum and lids, but without magnets.
Figure 3B:
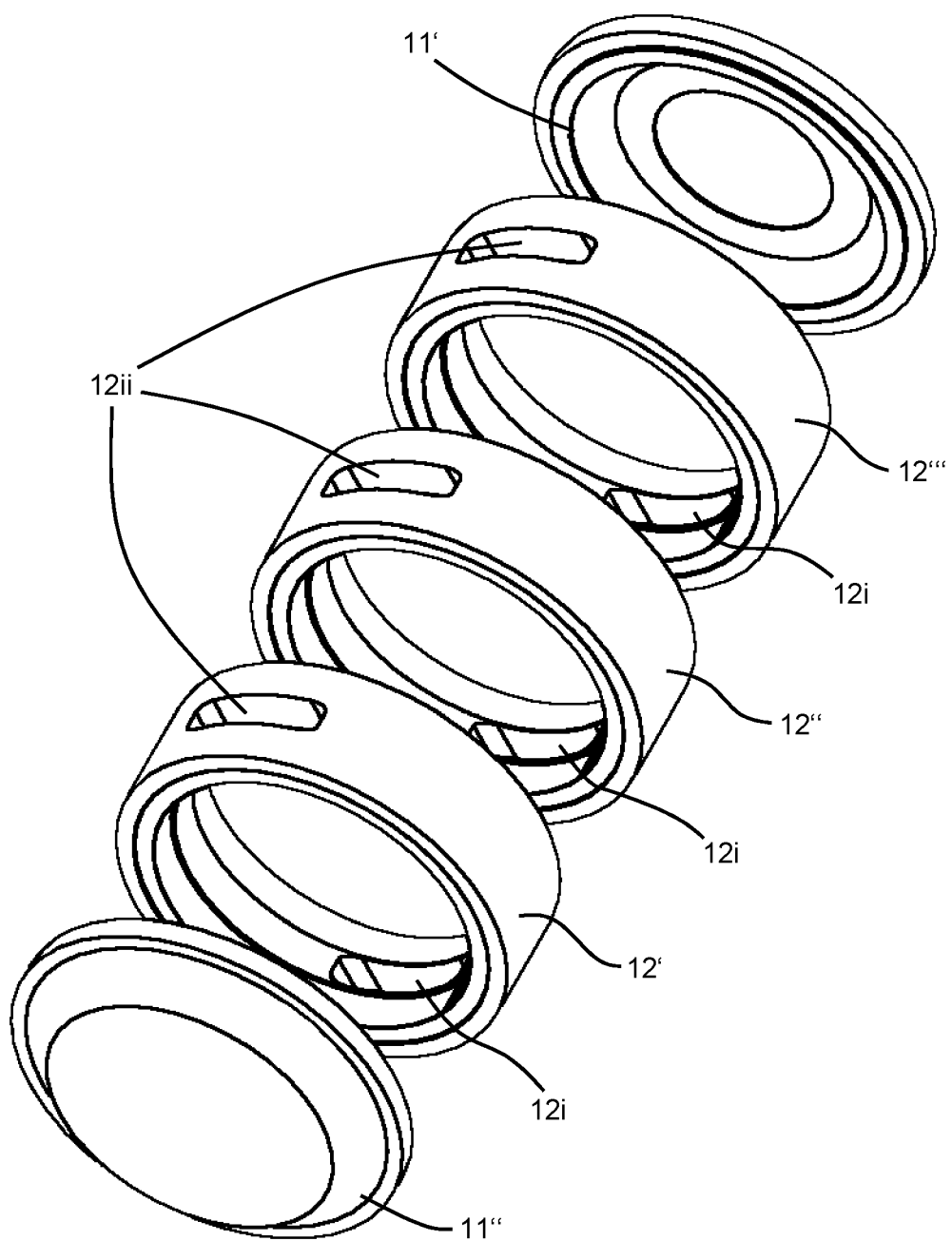
FIG. 3B shows the same as FIG. 3A, but with a plurality of drum assemblies.
Figure 4A:
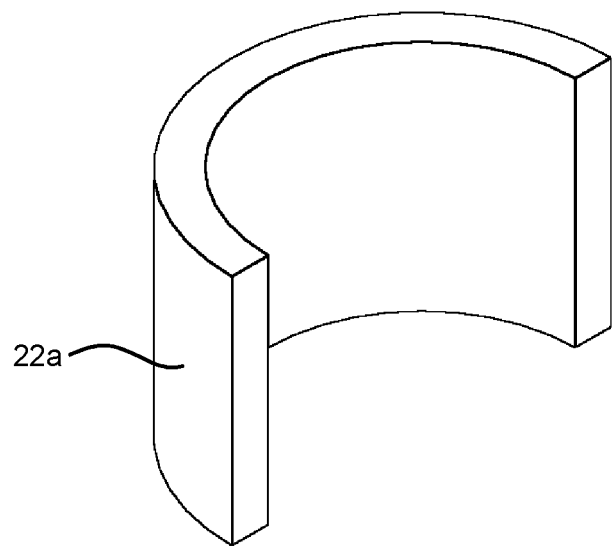
FIG. 4A shows a half-sectioned drum assembly in a cylindrical configuration.
Figure 4B:
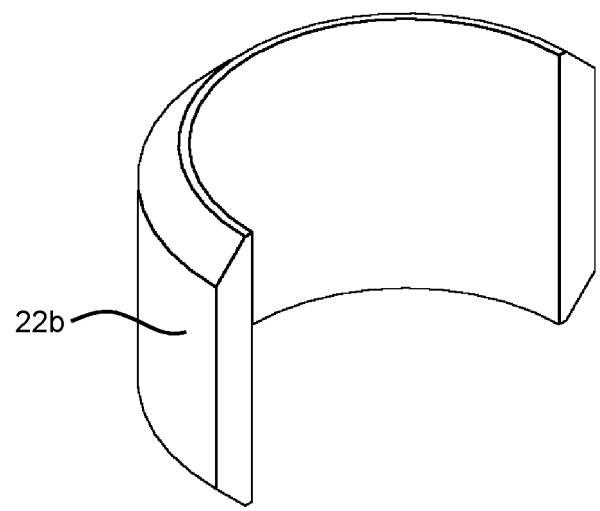
FIG. 4B shows the same as FIG. 4A, but with a conical edge shape.
Figure 4C:
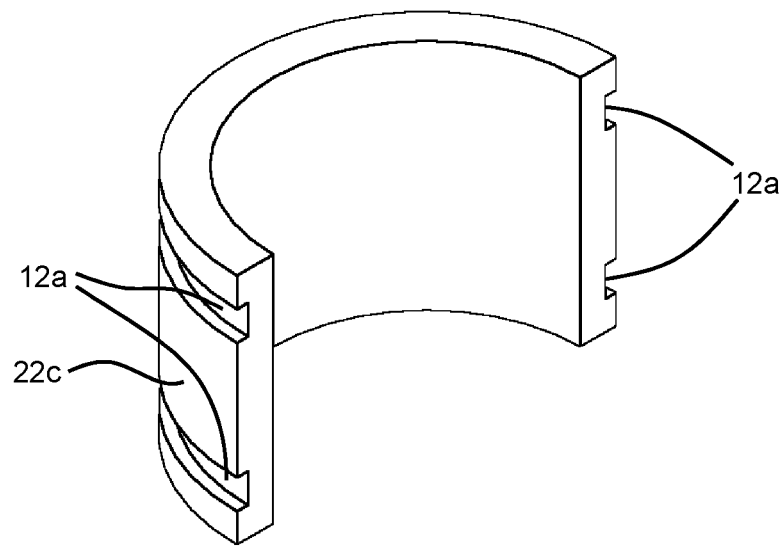
FIG. 4C shows the same as FIG. 4A, but with two circumferential grooves.
Figure 4D:
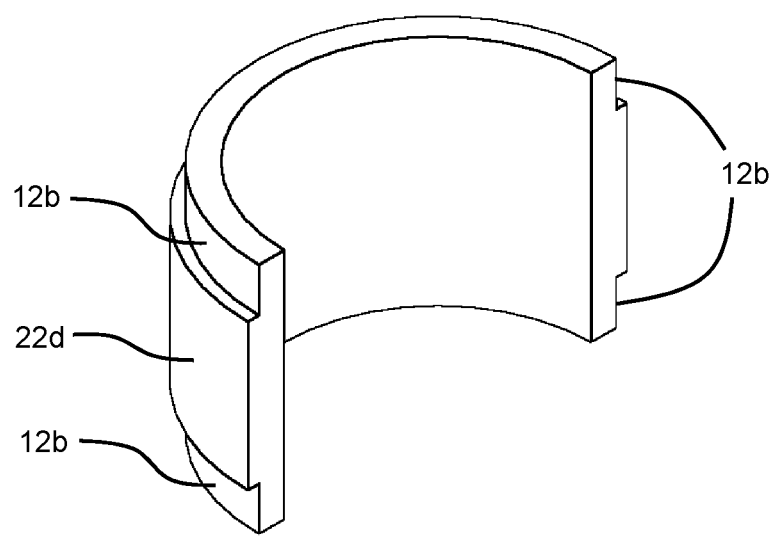
FIG. 4D shows the same as FIG. 4A, but with two circumferential steps.
Figure 5A:
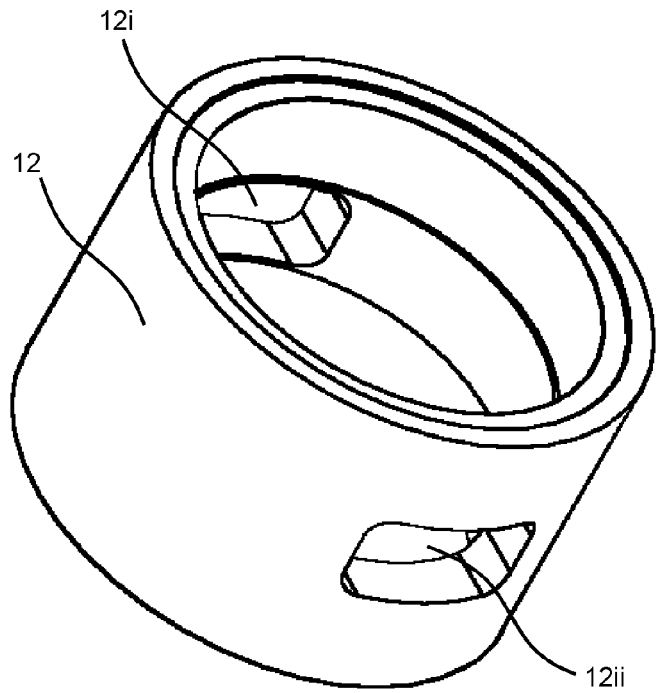
FIG. 5A shows a complete drum assembly of cylindrical configuration with diametrically arranged rectangular apertures.
Figure 5B:
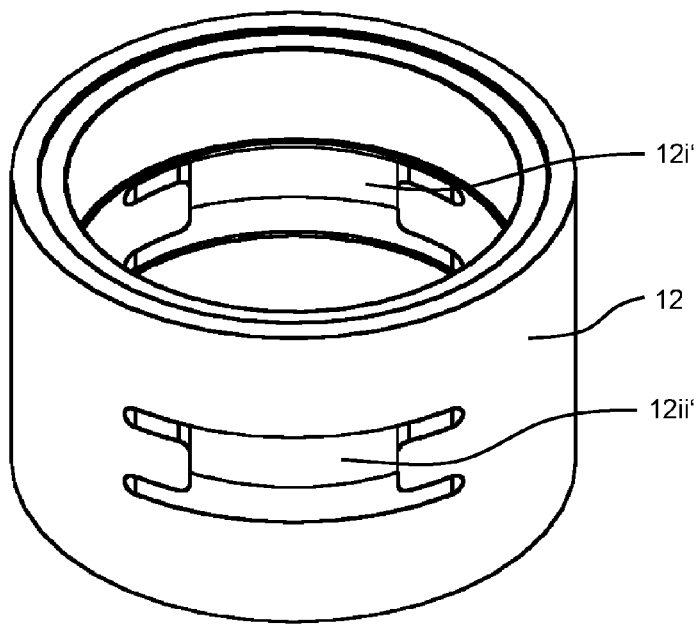
FIG. 5B shows the same as FIG. 5A, but with apertures having slit-shaped cutouts.
Figure 5C:
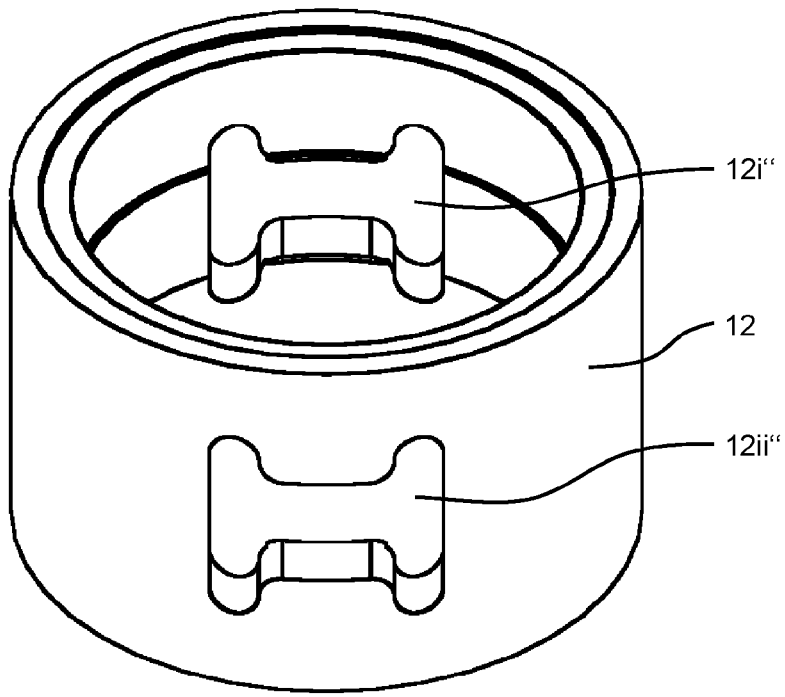
FIG. 5C shows the same as FIG. 5A, but with H-shaped apertures.
Figure 5D:
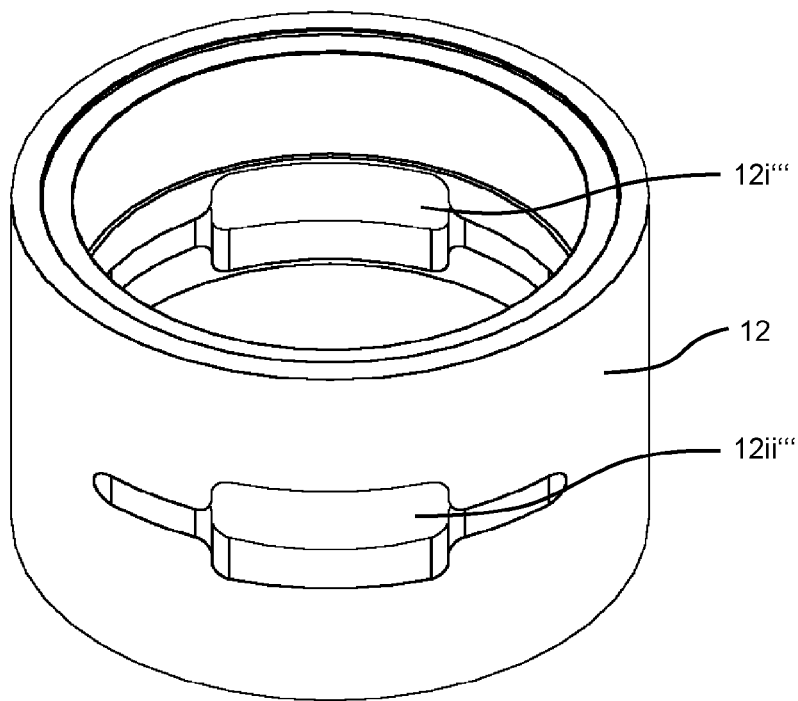
FIG. 5D shows the same as FIG. 5A, but with a wider configuration of the apertures.

As is shown in FIG. 3A, the yoke elements can have a single hollow cylindrical drum 12. However, as is shown in FIG. 3B, they can also have a plurality of hollow cylindrical drums 12', 12", 12'" arranged one after another in the axial direction.

FIGS. 3A, 3B and 5A to 5D show embodiments of the invention in which the hollow cylindrical drums 12; 12',12", 12'" of the yoke elements each have apertures 12i; 12ii; 12i'; 12ii'; 12i"; 12ii"; 12i'"; 12ii'" or access openings lying diametrically opposite each other in pairs with respect to the z axis, which apertures or access openings can have different geometrical configurations.

Figure 6A:
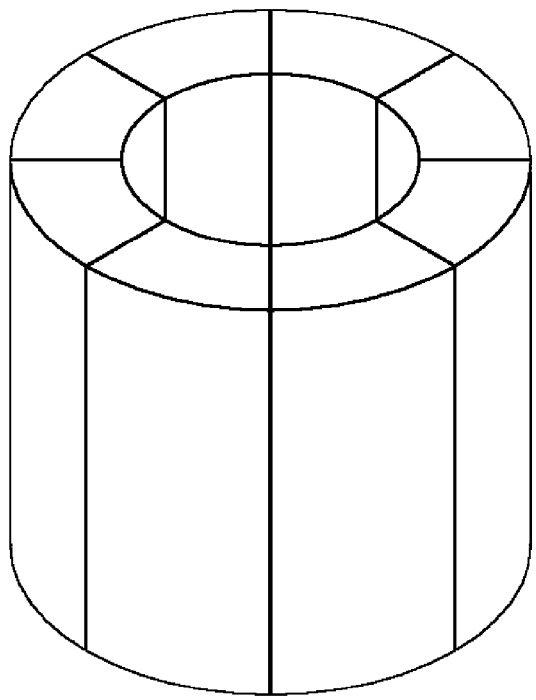
FIG. 6A shows a segmented magnet ring assembly with 8× division along the circumference.
Figure 6B:
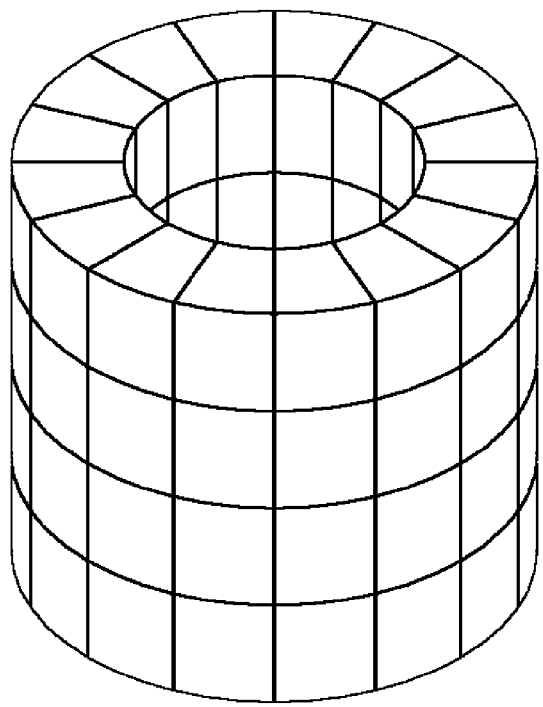
FIG. 6B shows the same as FIG. 6A, but with 16× division along the circumference and 4× axial division.

FIGS. 6A and 6B illustrate the many possibilities of a segmented configuration of the magnet elements that can be used in a magnet arrangement according to the invention. Thus, FIG. 6A shows a segmented magnet ring assembly with 8× division along the circumference, while FIG. 6B shows an assembly with 16× division along the circumference and 4× axial division.

Figure 7A:
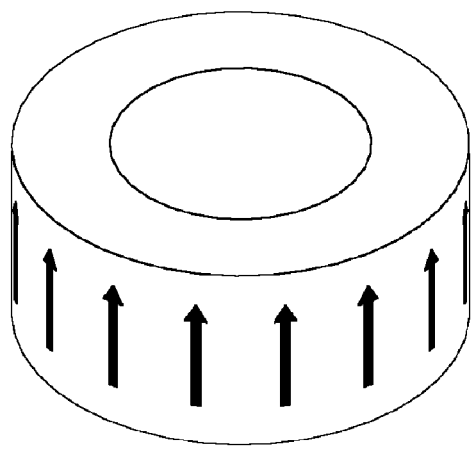
FIG. 7A shows a non-segmented magnet ring assembly with axial magnetization indicated by arrows.
Figure 7B:
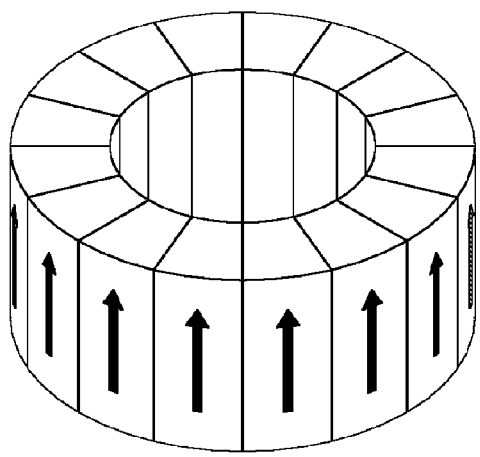
FIG. 7B shows the same as FIG. 7A, but with 16× segmentation along the circumference.
Figure 7C:
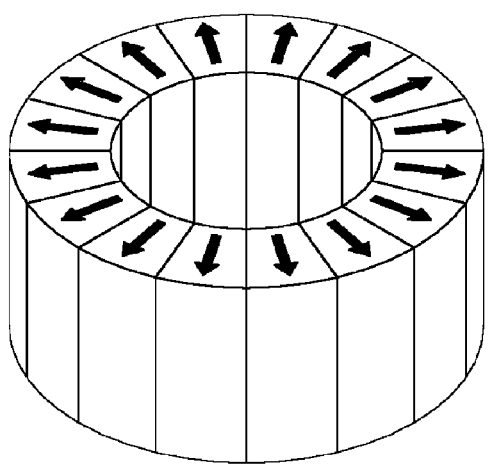
FIG. 7C shows the same as FIG. 7B, but with radial magnetization indicated by arrows.
Figure 8A:
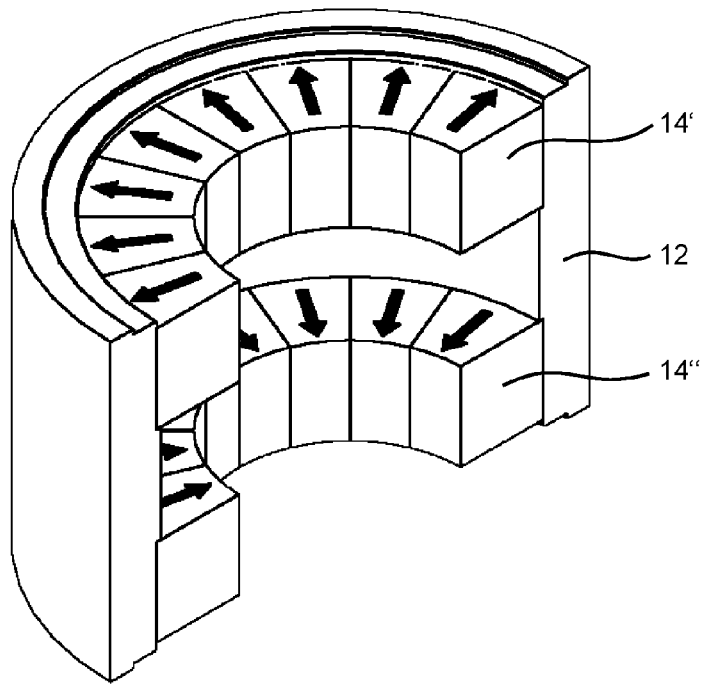
FIG. 8A shows a half-sectioned drum assembly with radial magnet segments.
Figure 8B:
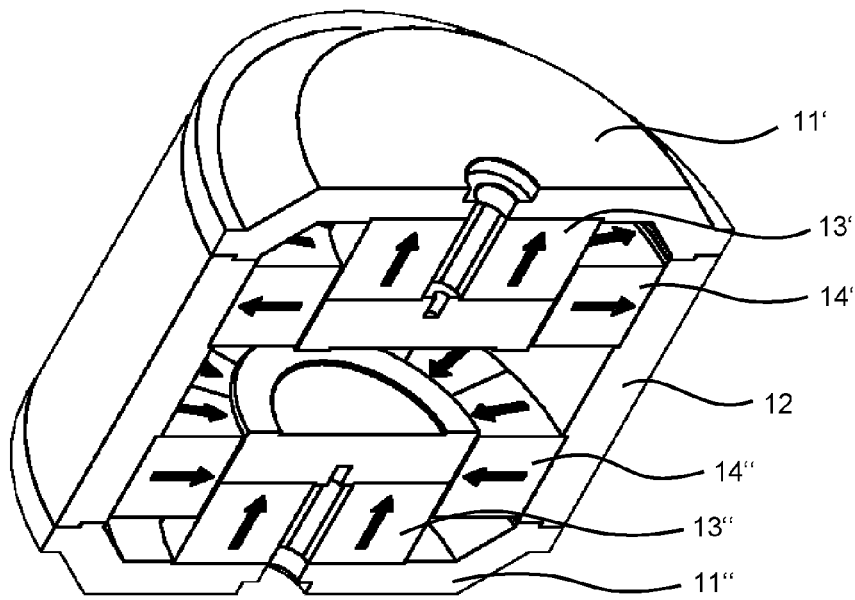
FIG. 8B shows the same as FIG. 1A, but with magnetizations of the magnet segments indicated by arrows.

FIGS. 7A to 8B each show a magnet ring assembly with magnetization indicated by arrows, specifically:

FIG. 7A shows a non-segmented magnet ring assembly with axial magnetization, FIG. 7B shows an assembly with 16× segmentation along the circumference and axial magnetization, FIG. 7C shows an assembly with 16× segmentation along the circumference and radial magnetization, FIG. 8A shows a drum assembly with radial magnet segments; and FIG. 8B shows magnet segments both with axial and also with radial magnetization.

Figure 9:
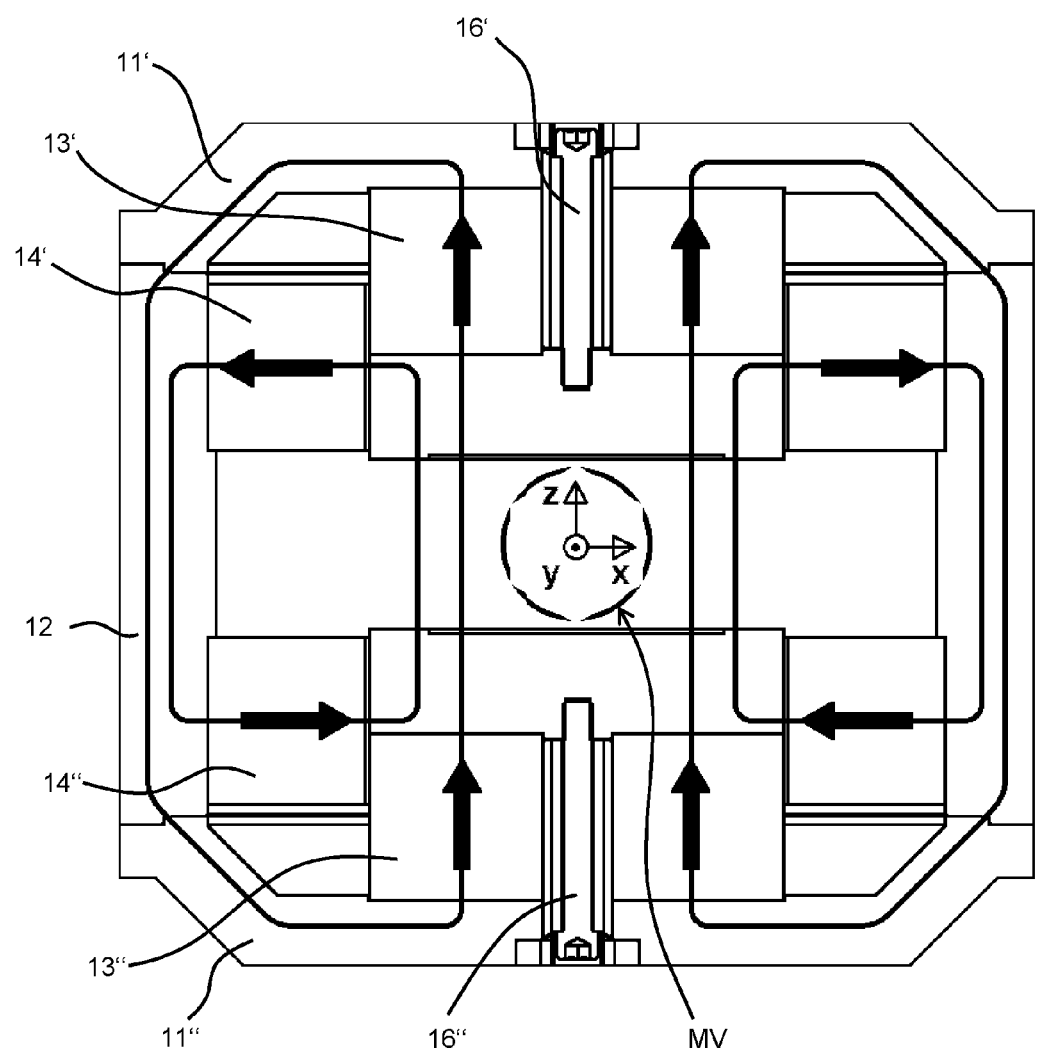
FIG. 9 shows the same as FIG. 8B, but in a sectional front view, and with a central fastening element and indicated measuring volume.

FIG. 9 moreover shows a sectional front view of an arrangement according to the invention with an indicated measuring volume and with magnetization arrows that are continued schematically to magnetic flux lines. It can also be seen that the pole piece elements are fixed on the respectively adjacent first lid 11' or second lid 11" of the yoke elements by a central fastening element 16', 16" of non-magnetic material, in particular by a pin, a bolt or a screw.

Figure 10A:
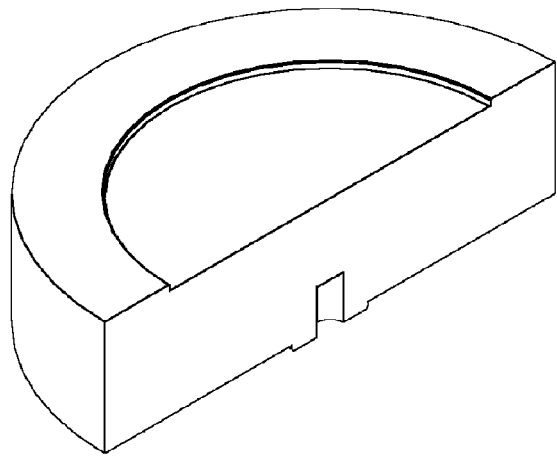
FIG. 10A shows as half-sectioned pole piece element in a one-part design.

FIG. 10A shows a half-sectioned pole piece element in a one-part design.

Figure 10B:
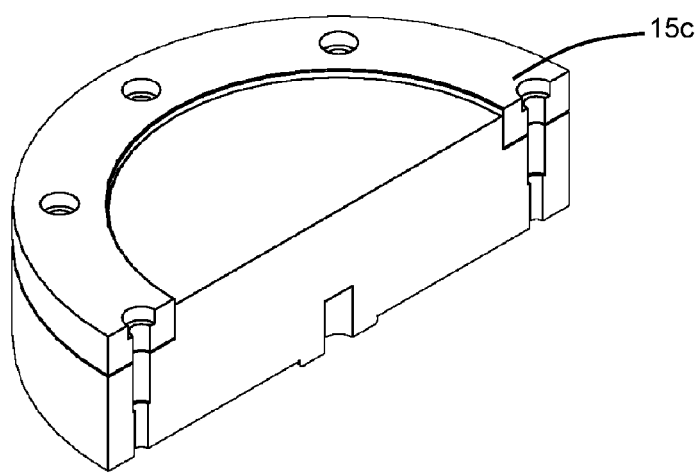
FIG. 10B shows the same as FIG. 10A, but in a two-part design with separate pole ring.

FIG. 10B shows a (likewise half-sectioned) pole piece element in a two-part design with a separate pole ring 15c.

Figure 10C:
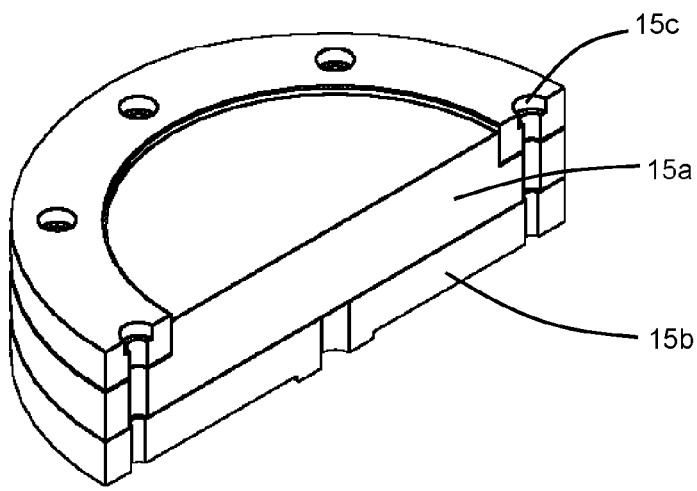
FIG. 10C shows the same as FIG. 10B, but in a three-part design with an additional separate pole plate.

FIG. 10C shows a three-part design of a pole piece element with a pole plate 15a, a pole cap 15b and an additional pole rings 15c.

FIG. 11, finally, shows a magnet arrangement according to the invention as has also already been shown in FIG. 1. Moreover, however, the magnet arrangement also contains fastening elements and adjusting elements for adjusting the lid elements. In particular, on the abutment surfaces between the lids 11', 11" and the drum 12, 12", respectively, a plurality of adjusting elements 17', 17" in the form of adjusting screws are provided, with which the abutment angle and/or the distance between the lids 11', 11" and the drum 12, 12", respectively, preferably in the range of ≤1 mm, can be adjusted and, consequently, the magnetic field can be homogenized. In this case, it is possible to use adjusting screws 17' which can be equipped for example with a hexagonal head and with which the lids 11', 11" can be raised by screwing these adjusting screws 17' into a corresponding thread in the respective lid 11', 11". By using further screws 17", which can be equipped for example with an Allen socket, the lids 11', 11" are braced against the respective drum 12, 12".

To produce a magnet arrangement according to the invention, the following method can be used:

making available the lids 11', 11" and hollow cylindrical drum(s) 12; 12',12",12'''; 22a; 22b; 22c; 22d of the yoke elements arranging the radial magnet rings 14', 14" on the inner surface of the drum(s) 12; 12',12",12'''; 22a; 22b; 22c; 22d fixing the axial magnets 13', 13" and the pole pieces on the first lid 11' and on the second lid 11" of the yoke elements moving the axial magnets 13', 13", fixed on the lids 11', 11", together with the pole pieces into the respective radial magnet rings 14', 14", which are located radially within the drum(s) 12; 12',12",12'''; 22a; 22b; 22c; 22d, such that the lids 11', 11" bear on the hollow cylindrical drum(s) 12; 12',12",12'''; 22a; 22b; 22c; 22d of the yoke elements, and the axial magnets 13', 13" are arranged at a defined position at least partially radially within the radial magnet rings 14', 14".

In order to homogenize the magnetic field, the first lid 11' and/or the second lid 11" is tilted relative to the z axis and/or rotated in the radial direction.

The radial magnet rings 14', 14" are mounted on the inner face of the hollow cylindrical drum(s) 12; 12',12",12'''; 22a; 22b; 22c; 22d at positions predefined by projections, steps 12b or grooves 12a.

LIST OF REFERENCE SIGNS

11' first lid
11" second lid
11a'; 11a" annular groove
11b'; 11b" shoulder
12, 12', 12" hollow cylindrical drum(s)
12a circumferential groove
12b circumferential step
12c step profile
12i; 12ii aperture
13' first cylinder-symmetrical axial magnet
13" second cylinder-symmetrical axial magnet
14', 14" cylinder-symmetrical radial magnet rings
15a pole cap
15b pole plate
15c pole ring
16', 16" fastening elements
17', 17" adjusting elements
MV measuring volume
z z axis

What is claimed is:

1. Magnet arrangement in a magnetic resonance apparatus with a permanent magnet system configured to generate a homogeneous magnetic field in a z-axis direction in a measuring volume, the permanent magnet system comprising: magnet elements, pole piece elements and yoke elements of magnetic material arranged cylinder-symmetrically with respect to the z axis, wherein the yoke elements comprise a first lid, a second lid and at least one hollow cylindrical drum arranged axially between the lids with respect to the z axis, wherein the yoke elements enclose the measuring volume both axially and radially, wherein the magnet elements each comprise at least one pair of cylinder-symmetrical axial magnets and one pair of cylinder-symmetrical radial magnet rings, wherein the axial magnets are each arranged axially adjoining a side of the first lid facing towards the measuring volume and/or adjoining a side of the second lid facing towards the measuring volume, wherein the axial magnets are arranged radially within the radial magnet rings and respectively axially further away from the measuring volume than the radial magnet rings, and wherein: external diameter of the axial magnets≤internal diameter of the radial magnet rings.

2. Magnet arrangement according to claim 1, wherein the yoke elements, the magnet elements and the pole piece elements each have circular cylinder symmetry or cylinder symmetry with polygonal cross-sectional surfaces perpendicular to the z axis.

3. Magnet arrangement according to claim 1, wherein the yoke elements comprise a plurality of hollow cylindrical drums arranged axially one alongside another.

4. Magnet arrangement according to claim 1, wherein the radial magnet rings and/or the axial magnets form segments or wedges that extend radially and/or parallel to a circumference of the drum in an azimuthal direction.

5. Magnet arrangement according to claim 1, wherein the at least one hollow cylindrical drum of the yoke elements has on an outer jacket surface thereof at least one circumferential groove and/or at least one circumferential step, and/or has a stepped profile on an inner surface thereof.

6. Magnet arrangement according to claim 1, wherein the at least one hollow cylindrical drum of the yoke elements has at least one aperture and/or at least two access openings arranged radially opposite one another with respect to the z axis.

7. Magnet arrangement according to claim 1, wherein the first lid and/or the second lid of the yoke elements is discus-shaped or tapers conically in an axial direction away from the measuring volume.

8. Magnet arrangement according to claim 1, wherein the first lid and/or the second lid of the yoke elements has, along the z axis, a centring portion protruding in an axial direction towards the measuring volume.

9. Magnet arrangement according to claim 1, wherein the first lid and/or the second lid of the yoke elements has a side protruding towards the measuring volume, on which side is formed an annular groove, a step and/or a shoulder as a limit stop or for securing the axial magnets.

10. Magnet arrangement according to claim 1, wherein the pole piece elements are configured axially in two parts with a pole plate and a pole cap, or in three parts with a pole plate, a pole cap and a pole ring.

11. Magnet arrangement according to claim 1, wherein the pole piece elements are fixed respectively adjacently on the first lid or on the second lid of the yoke elements by at least one non-magnetic fastening element.

12. Magnet arrangement according to claim 11, wherein the at least one non-magnetic fastening element comprises a pin, a bolt or a screw.

13. Magnet arrangement according to claim 1, wherein at least one adjusting element is provided on an abutment face between at least one of the lids and the drum, respectively, with which an abutment angle and/or a distance between the lids and the drum, is adjustable, to provide a homogenized magnetic field.

14. Magnet arrangement according to claim 13, wherein the at least one adjusting element comprises a plurality of adjusting screws, and wherein an abutment angle and/or a distance between the lids and the drum is adjustable in a range ≤5 mm.

15. Magnet arrangement according to claim 1, wherein the radial magnet rings are arranged on an inner surface of the hollow cylindrical drum that faces towards the measuring volume.

16. Method for producing a magnet arrangement according to claim 1, comprising:
   making available the lids and the at least one hollow cylindrical drum of the yoke elements,
   arranging the radial magnet rings on an inner surface of the at least one drum,
   fixing the axial magnets and the pole pieces on the first lid and on the second lid of the yoke elements,
   moving the axial magnets, fixed on the lids, together with the pole pieces into the respective radial magnet rings, which are located radially within the at least one drum, such that the lids bear on the at least one drum of the yoke elements, and the axial magnets are arranged at a defined position at least partially radially within the radial magnet rings.

17. Method according to claim 16, further comprising homogenizing the magnetic field by tilting the first lid and/or the second lid relative to the z axis and/or rotating the first lid and/or the second lid about the z axis.

18. Method according to claim 16, further comprising mounting the radial magnet rings on an inner face of the at least one hollow cylindrical drum at positions predefined by projections or steps.

* * * * *